United States Patent
Kirby et al.

(10) Patent No.: US 9,046,569 B2
(45) Date of Patent: Jun. 2, 2015

(54) SEAL METHOD FOR DIRECT LIQUID COOLING OF PROBES USED AT FIRST LEVEL INTERCONNECT

(71) Applicants: Ronald Kirby, Portland, OR (US); James G. Maveety, Campbell, CA (US); Joe Walczyk, Tigard, OR (US)

(72) Inventors: Ronald Kirby, Portland, OR (US); James G. Maveety, Campbell, CA (US); Joe Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 246 days.

(21) Appl. No.: 13/669,020

(22) Filed: Nov. 5, 2012

(65) Prior Publication Data

US 2014/0125367 A1  May 8, 2014

(51) Int. Cl.
G01R 31/00 (2006.01)
G01R 31/28 (2006.01)
H01L 21/00 (2006.01)

(52) U.S. Cl.
CPC ............ *G01R 31/2877* (2013.01); *H01L 21/00* (2013.01); *G01R 31/286* (2013.01); *G01R 31/2862* (2013.01)

(58) Field of Classification Search
CPC ............ G01R 1/0408; G01R 31/2886; G01R 1/0491; G01R 31/2865; G01R 31/2887; G01R 31/2891; G01R 31/2855; G01R 31/2863; G01R 31/2851; G01R 31/2889; G01R 31/307; G01R 1/07378; G01R 1/025; G01R 31/2874; G01R 31/2875
See application file for complete search history.

(56) References Cited

U.S. PATENT DOCUMENTS

| | | | | |
|---|---|---|---|---|
| 5,198,753 | A  * | 3/1993 | Hamburgen | 324/750.08 |
| 6,373,271 | B1 * | 4/2002 | Miller et al. | 324/750.14 |
| 2007/0197062 | A1 * | 8/2007 | Bagley et al. | 439/106 |
| 2010/0141288 | A1 * | 6/2010 | Di Lello | 324/755 |

* cited by examiner

*Primary Examiner* — Vinh Nguyen
(74) *Attorney, Agent, or Firm* — Schwegman Lundberg & Woessner, P.A.

(57) ABSTRACT

Embodiments of an apparatus and method for providing cooling of probes for testing of integrated circuits are generally described herein. In some embodiments, an apparatus comprises a probe head assembly configured to hold one or more probes that are adapted to provide electrical contact with an integrated circuit device under test (DUT), a DUT chuck adapted to hold the DUT for contact with the probes, a seal arranged between the probe head assembly and the DUT chuck to form a chamber when the seal is in contact with the probe head assembly and the DUT chuck, and a first port and a second port arranged to provide fluid flow into and fluid flow out of the chamber.

23 Claims, 9 Drawing Sheets

SEAL METHOD FOR DIRECT LIQUID COOLING OF PROBES USED AT FIRST LEVEL INTERCONNECT

TECHNICAL FIELD

Embodiments pertain to testing of integrated circuits or ICs. Some embodiments relate to IC test fixtures that allow for cooling of IC test probes.

BACKGROUND

Feature sizes of integrated circuits or ICs continue to decrease. This provides challenges to manufacturers of ICs, one of which is the testing of ICs. The reduction in the pitch of IC interconnects leads to reduction in the cross sectional area of probes that are used contact the ICs and connect the ICs to test equipment. The cross sectional area of a probe impacts the ability of the probe to carry current. A small cross sectional area can lead to the probe burning when current is applied to the probe or to burning at the probe/IC interface (e.g., an IC pad). IC processes have begun to reach the point where probes that can be used to test the manufactured ICs no longer have sufficient cross sectional area to avoid probe burns. Thus, there are general needs for systems and methods that reduce destruction of probes and IC die associated with smaller probe size.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously herein, IC feature sizes have begun to reach the point where probes used to test ICs no longer have sufficient cross sectional area to avoid probe burns. One solution to offset the reduction in cross sectional area is to cool the probes. This would allow the probes to carry the desired current without burning. Direct cooling of the probes may increase the current carrying capacity of the probes by several hundred percent over baseline, but sealing at least a portion of the device under test (DUT) to contain the coolant is difficult.

Figure 1:
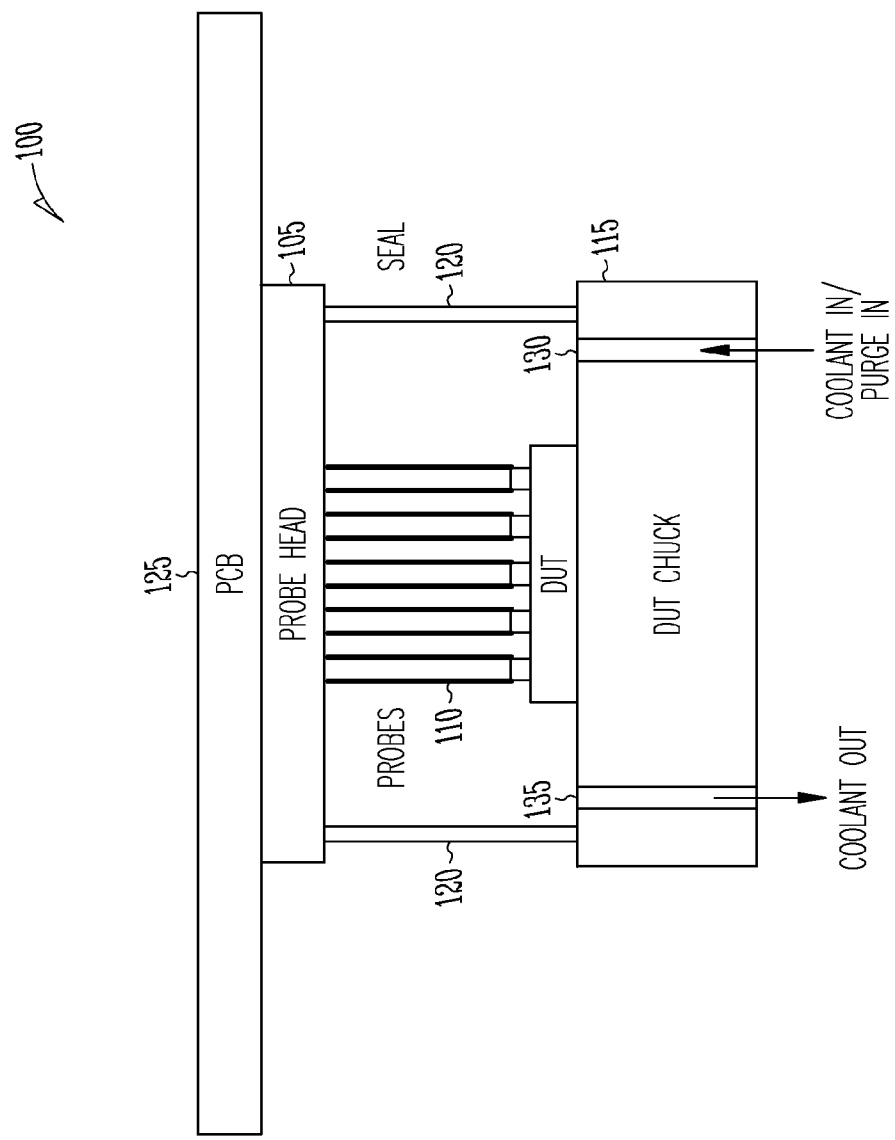
FIG. 1 shows portions of an example of a device to provide cooling of test probes in accordance with some embodiments.

FIG. 1 shows portions of an example of a device 100 to provide cooling of test probes. The device can be included in a wafer tester (e.g., wafer probing station) or a tester for an IC separated from a wafer. The device 100 includes a probe head assembly 105 that can hold one or more probes 110. The probes 110 can be included in a probe card having an array of probes that carry current during testing of the DUT. The probe card is typically replaceable and the probes 110 of the probe card can be micro-spring probes. The probes 110 are used to provide electrical contact with an integrated circuit device under test (DUT). The probe head assembly 105 can be in electrical communication with a printed circuit board (PCB) that provides for routing of electrical signals between the IC tester and the DUT. In some examples, the PCB 125 provides signal processing functions such as filtering and amplification of electrical signals.

The device 100 also includes a DUT chuck 115 to hold a DUT for electrical contact with the probes 110. When the DUT is mounted on the DUT chuck 115, one or both of the DUT chuck 115 and the probe head assembly 105 can be movable to provide contact between the probes 110 and DUT.

The device 100 further includes a seal 120 arranged between the probe head assembly 105 and the DUT chuck 115. The seal 120 forms a chamber by providing walls for the chamber when the seal 120 is in contact with the probe head assembly 105 and the DUT chuck 115. The seal 120 can include an elastomer material (e.g., silicone). The seal 120 can be mounted on the probe head assembly 105 and the seal 120 contacts the DUT chuck 115 when the probe head assembly 105 is moved toward the DUT chuck 115. In another arrangement, the seal 120 can be mounted on the DUT chuck 115 and the seal 120 contacts the probe head assembly 105 when the probe head assembly is moved toward the DUT chuck 115.

Figure 8:
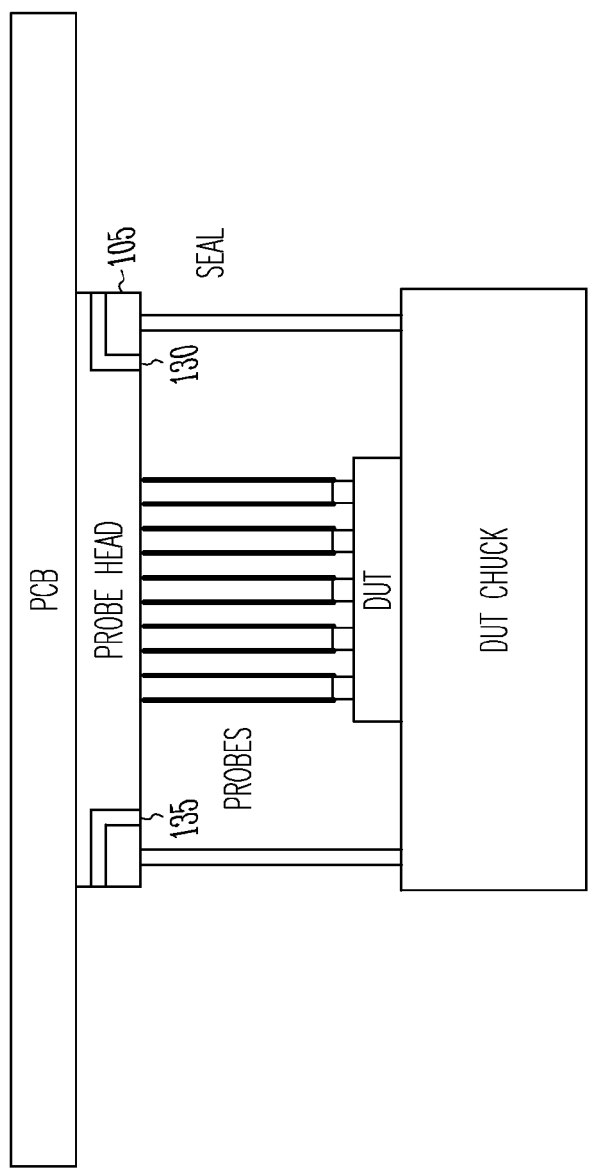
Figure 9:
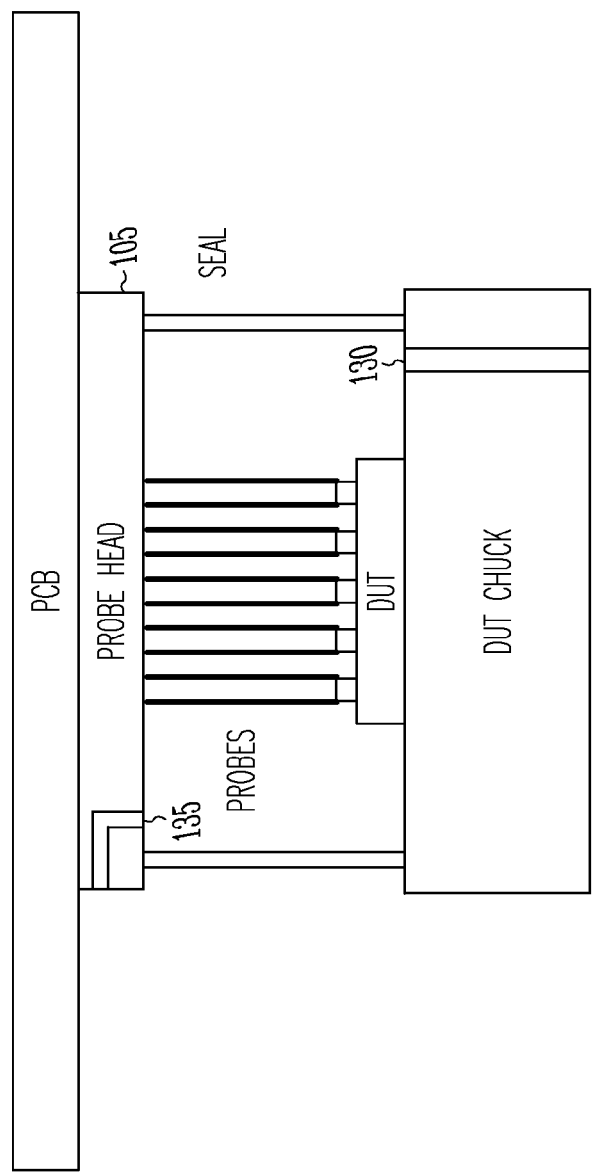

The chamber formed with the seal 120 can contain the coolant used to cool the probes 110 during testing of the DUT or during a portion of the testing of the DUT. The device 100 can include liquid ports for coupling to a liquid source that provides a coolant (e.g., Fluorinert™) to the probes 110. In the example shown in the Figure, the device 100 includes a first port 130 and a second port 135 that provide liquid inflow and outflow to the chamber. Coolant may be introduced or injected via one port and warmed coolant can exit via the other port. As shown, the first and second ports are included in the DUT chuck 115. However, other arrangements may be useful. For instance, the first and second ports can be included in the probe head assembly 105 (as shown in FIG. 8), or one port (e.g., the first port 130) can be included in the DUT chuck 115 and the other (e.g., the second port 135) can be included in the probe head assembly 105 (as shown in FIG. 9).

Securing or mounting the seal to the probe head assembly 105 or the DUT chuck 115 can prevent the seal from moving or falling out of place during the testing. A vertical force provided by the probe head assembly 105 or the DUT chuck 115 can maintain the seal on the other surface. To minimize the impact the probe testing, the applied vertical force can be kept under 10 pound force (10 lbf). In some examples, the seal 120 can be 6 millimeters (6 mm) tall as long as the working pressure of the coolant within the seal remains below 15 pounds per square inch (15 psi). The seal material may be flexible and have compliance in the vertical direction of about 100 to 200 micrometers (100-200 μm) to allow some vertical displacement of the probes while the seal is maintained. This allows the device 100 to maintain a seal for the chamber when the probes 110 are positioned above the DUT and when the probes contact the DUT.

Figure 2:
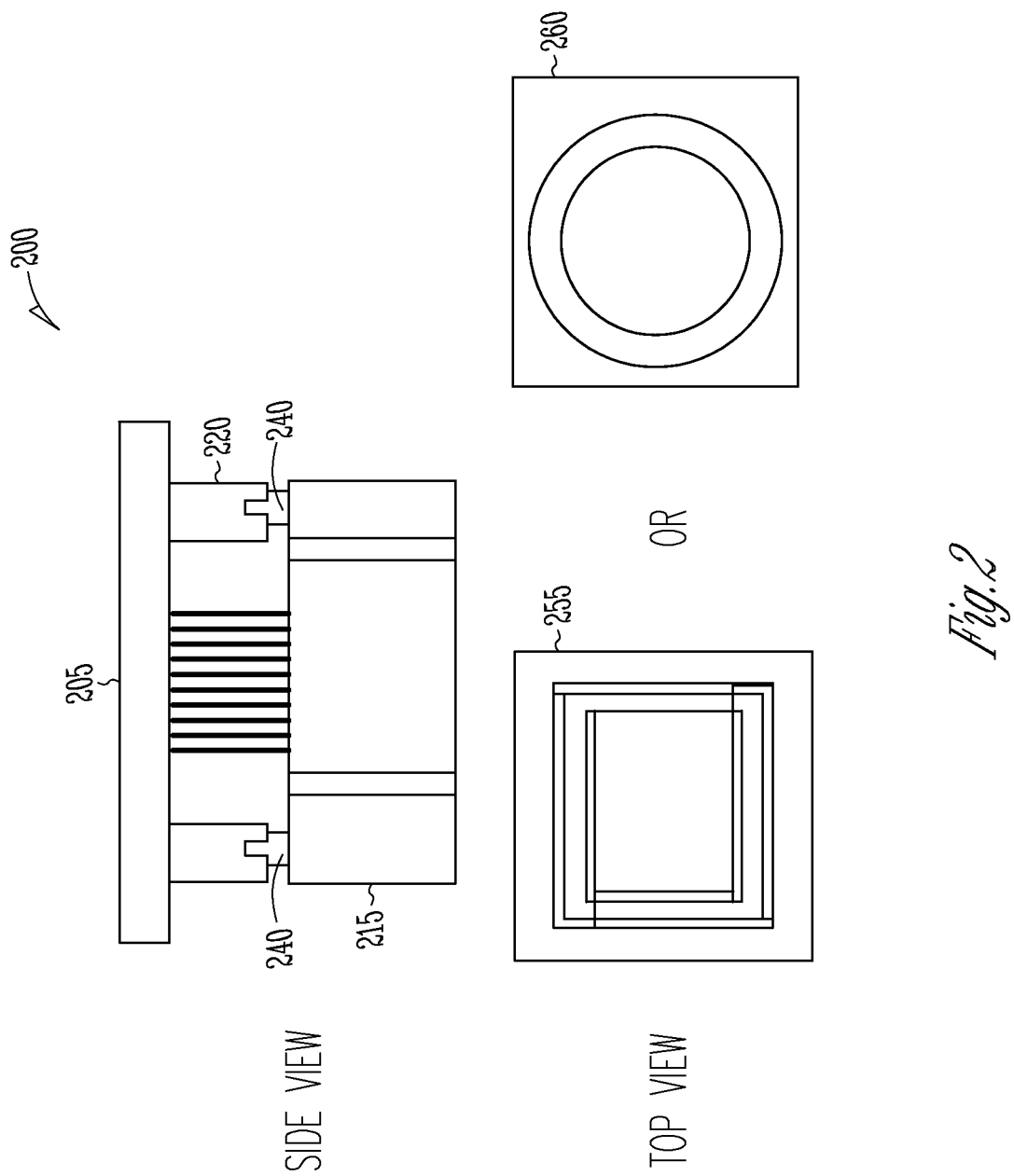
FIGS. 2-6 and 8-10 show additional examples of devices to provide cooling of test probes in accordance with various embodiments.

FIG. 2 shows other examples of portions of a device 200 to provide cooling of test probes. The side view shows an example of a seal 220 mounted on a probe head assembly 205. The DUT chuck 215 includes a surface with one or more ribbed structures 240 formed on the surface of the DUT chuck 215 to contact a surface of the seal 220. The seal 220 includes an undercut to help secure the seal 220 to the ribbed structures 240. Securing or mounting the seal 220 to one surface (e.g., the downward surface of the probe head assembly 205) and providing ribs 240 on the other surface (e.g., the upward surface of the DUT chuck 215) that engage the seal 220 may allow for higher working pressures within the chamber formed by the seal 220. FIG. 2 also shows top views of a square shaped seal 255 and a circular shaped seal 260.

Figure 3:
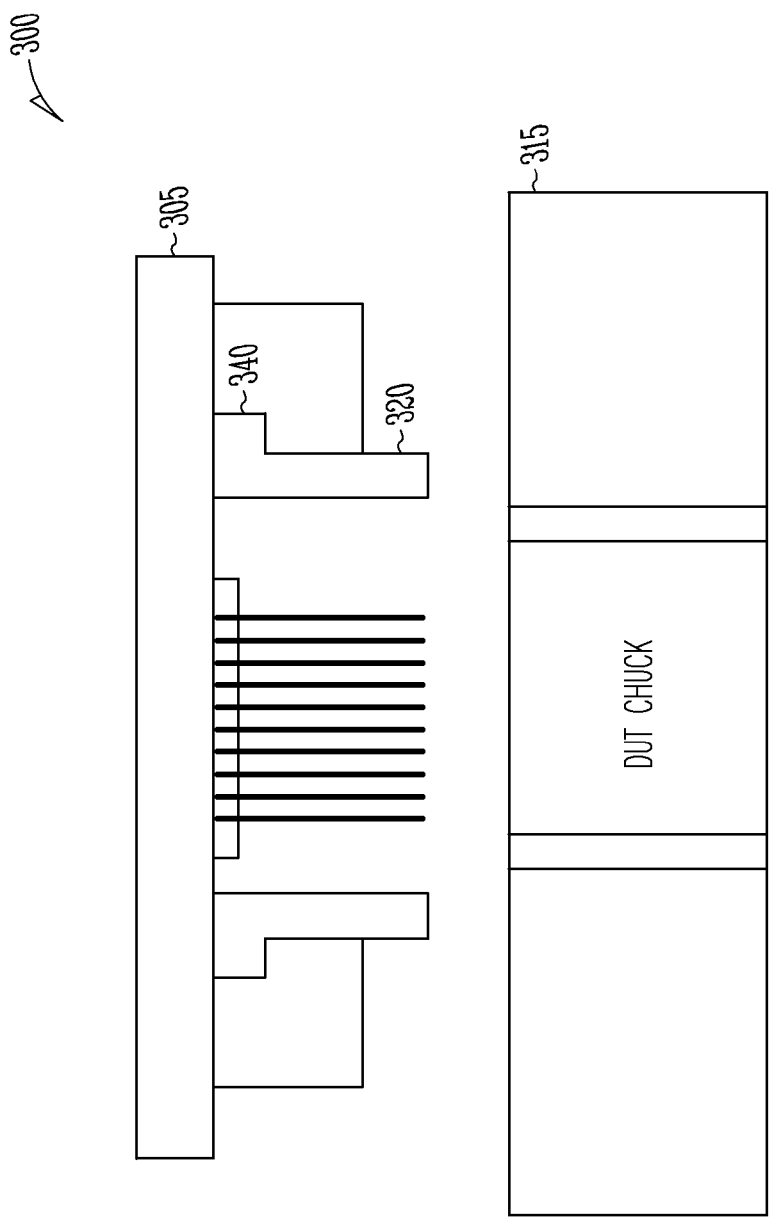

FIG. 3 shows still another example of portions of a device 300 to provide cooling of test probes. The example shows the seal 320 secured to the probe head assembly 305 using complimenting rib structures 340 of the seal 320 and probe head assembly 305. In another example, the seal 320 is secured to the DUT chuck 315 using complimenting rib structures of the seal 320 and DUT chuck 315.

Figure 4:
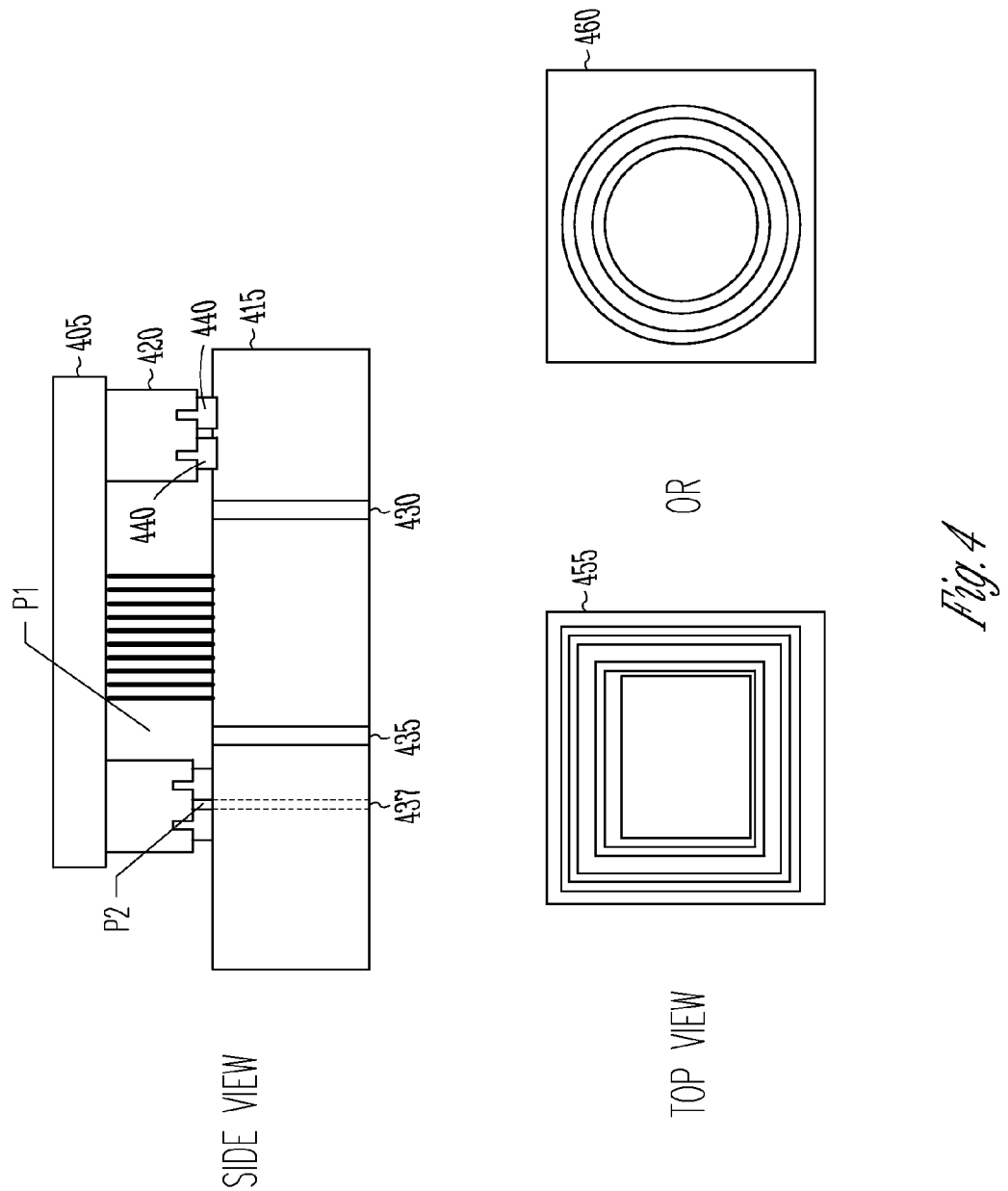
Figure 10:
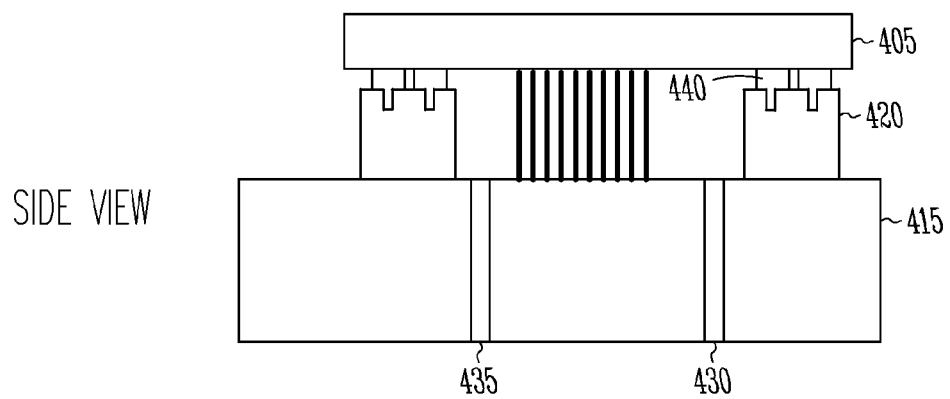

FIG. 4 shows still another example of portions of a device 400 to provide cooling of test probes. The device 400 includes a seal 420 having a double wall. The seal 420 forms a double-walled chamber when the seal 420 is in contact with the probe head assembly 405 and the DUT chuck 415. The seal 420 can be undercut to contact ribbed structures 440 on the surface of the DUT chuck 415. In the example shown, the seal 420 is secured or mounted to the surface of the probe head assembly 405 and the ribbed structures 440 are located on the surface of the DUT chuck 415. A different arrangement can be used (shown in FIG. 10) where the seal is mounted to the DUT chuck 415 and the ribbed structures are on the surface of probe head assembly 405.

FIG. 4 also shows top views of a square shaped double-walled seal 455 and a circular shaped double-walled seal 460.

The double-walled seal allows for two chambers to surround the DUT: a first chamber to contain the DUT and a second chamber between the double walls of the seal 420. In some examples, the device 400 includes a third port 437 (shown using dashed lines) to access the chamber between the double walls of the seal. The first and ports (430, 435) can be used to provide a first pressure (P1 in the Figure) to the inner chamber and the third port can be used to provide pressure (P2 in the Figure) between walls of the double-wall of the seal. Positive pressure applied between the two chambers (P2>P1) will aid in sealing the coolant within the seal 420. The double-walled seal provides a backup in case the first seal fails, and the positive pressure prevents liquid from escaping.

Figure 5:
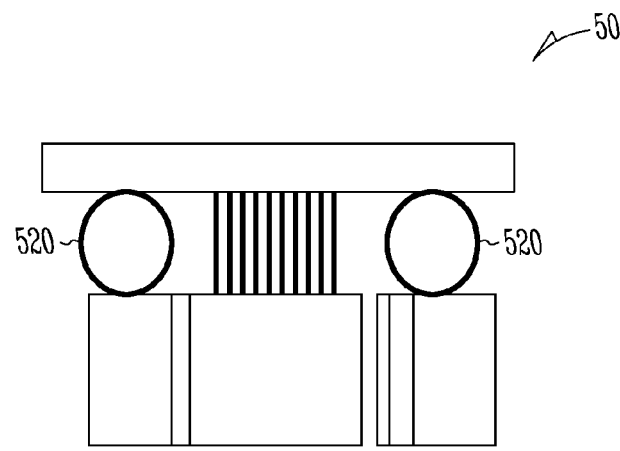

FIG. 5 shows still another example of portions of a device 500 to provide cooling of test probes. The Figure shows a side view of a seal 520 that includes a bladder that is inflatable with a gas or with a liquid. The bladder provides a balanced sealing force around the probe and DUT region.

Figure 6:
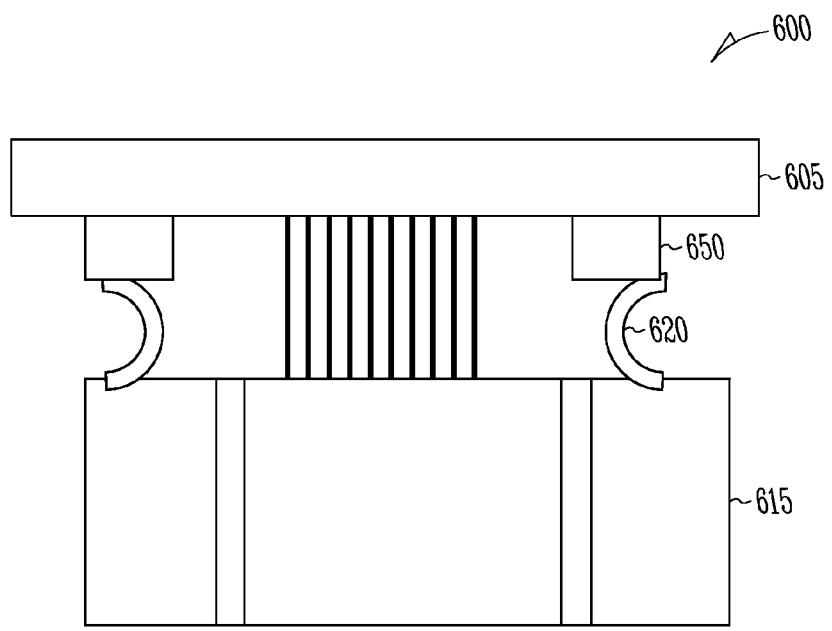

FIG. 6 shows still another example of portions of a device to provide cooling of test probes. The Figure shows a side view of a seal 620 that is a bellowed gasket. When the probes are in contact or near-contact with the DUT, the walls of the gasket are configured (e.g., by shape and size) to become bellowed or deflect horizontally (e.g., deflect in as shown), or in a direction perpendicular to the height of the walls of the gasket. This can be caused by having the height of the walls of the gasket being longer than the distance between the probe head assembly 605 and the DUT chuck 615. The bellowing can also be caused by reducing the distance between the probe head assembly 605 and the DUT chuck 615 relative to the height of the walls of the gasket seal. For instance, one or both of the probe head assembly 605 and the DUT chuck 615 can include a stop to cause the gasket walls to bellow when the probes are in contact or in near-contact (e.g., 100-200 μm) with the DUT. In some examples, the walls of the gasket are shaped to cause deflection in a specific direction when a vertical force is applied to one or more ends of the walls of the gasket.

Figure 7:
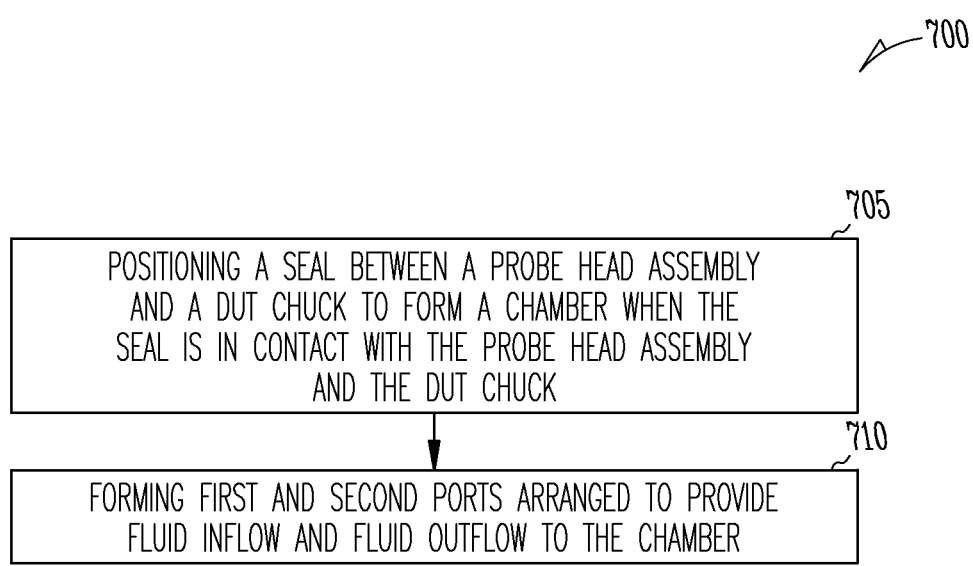
FIG. 7 shows a flow diagram of an example of a method of making a device to provide cooling of test probes in accordance with some embodiments.

FIG. 7 shows a flow diagram of an example of a method 700 of making a device to provide cooling of test probes. At block 705, a seal is positioned between a probe head assembly and a DUT chuck to form a chamber when the seal is in contact or near-contact with the probe head assembly and the DUT chuck. The probe head assembly is configured to hold one or more probes that provide electrical contact with the DUT, and the DUT chuck is configured to hold the DUT for contact with the probes. The positioning of the seal can include mounting the seal on the probe head assembly or mounting the seal on the DUT chuck.

At block 710, first and second ports are formed and are arranged to provide liquid inflow and liquid outflow to the chamber when the chamber is formed. A port can be formed in one or both of the probe head assembly and the DUT chuck.

In some examples, the seal includes a double-wall seal that forms a double-wall chamber when the seal is in contact with the probe head assembly and the DUT chuck. The method 700 can include forming a third port arranged to provide a positive pressure to a region between walls of the double-wall seal. In some examples, the seal includes a bladder that can be inflated to form a seal between the probe head assembly and the DUT chuck. In some examples, the seal includes a gasket having walls that deflect to form a bellowed gasket when a vertical force is applied to the walls of the seal.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:
1. An apparatus comprising:
   a probe head assembly (105) configured to hold one or more probes (110), wherein the probes are adapted to provide electrical contact with an integrated circuit device under test (DUT);
   a DUT chuck (115) adapted to hold the DUT for contact with the probes;
   a seal (120) arranged between the probe head assembly and the DUT chuck to form a chamber when the seal is in contact with the probe head assembly and the DUT chuck; and a first port (130) and a second port (135) arranged to provide flow of liquid into and out of the chamber, wherein said one of said first and second ports is located within said DUT chuck.

2. The apparatus of claim 1, wherein the seal is mounted on the probe head assembly and is arranged to contact the DUT chuck when the DUT chuck is moved toward the probe head assembly.

3. The apparatus of claim 1, wherein the seal is mounted on the DUT chuck and is arranged to contact the probe head assembly when the DUT chuck is moved toward the probe head assembly.

4. The apparatus of claim 1, wherein the first and second ports are included in the DUT chuck.

5. The apparatus of claim 1, wherein the first and second ports are included in the probe head assembly.

6. The apparatus of claim 1, wherein the first port is included in the DUT chuck and the second port is included in the probe head assembly.

7. The apparatus of claim 1, wherein the seal (420) includes a double wall arranged to form a double-walled chamber when the seal is in contact with the probe head assembly and the DUT chuck.

8. The apparatus of claim 7, including a third port arranged to provide a pressure between walls of the double-wall of the seal.

9. The apparatus of claim 7, wherein the probe head assembly includes a ribbed surface arranged to contact a surface of the seal.

10. The apparatus of claim 7, wherein the DUT chuck includes a ribbed surface arranged to contact a surface of the seal.

11. The apparatus of claim 1, wherein the seal includes a bladder (520), wherein the bladder is inflatable with a gas or a fluid.

12. The apparatus of claim 1, wherein the seal comprises a flexible material and maintains a seal for the chamber when the probe head assembly positions the one or more probes above the DUT and when the probe head assembly positions the one or more probes to contact the DUT.

13. The apparatus of claim 1, wherein the probe header assembly includes a probe card having an array of probes that carry current during testing of the DUT.

14. The apparatus of claim 1, wherein walls of the seal are configured to form a bellowed gasket (620) when the probes are in contact or in near-contact with the DUT.

15. A method comprising:
positioning a seal between a probe head assembly and a DUT chuck to form a chamber when the seal is in contact with the probe head assembly and the DUT chuck, wherein the probe head assembly is adapted to hold one or more probes that provide electrical contact with the DUT, and the DUT chuck is adapted to hold the DUT for contact with the probes; and
forming first and second ports arranged to provide flow of liquid into and out of the chamber, wherein said one of said first and second ports is located within said DUT chuck.

16. The method of claim 15, wherein positioning the seal includes mounting the seal on the probe head assembly.

17. The method of claim 15, wherein positioning the seal includes mounting the seal on the DUT chuck.

18. The method of claim 15, wherein positioning a seal includes positioning a double-wall seal between a probe head assembly and a DUT chuck to form a double-wall chamber when the seal is in contact with the probe head assembly and the DUT chuck.

19. The method of claim 15, including forming a third port arranged to provide a positive pressure to a region between walls of the double-wall seal.

20. The method of claim 15, wherein positioning a seal includes positioning a seal having a bladder between a probe head assembly and a DUT chuck to form the chamber when the bladder of the seal is inflated and the inflated seal is in contact with the probe head assembly and the DUT chuck.

21. A system comprising:
a probe head assembly (105) configured to hold one or more probes (110), wherein the probes are adapted to provide electrical contact with an integrated circuit device under test (DUT);
a DUT chuck (115) adapted to hold the DUT for contact with the probes;
a seal (120) arranged between the probe head assembly and the DUT chuck to form a chamber when the seal is in contact with the probe head assembly and the DUT chuck;
a first port (130) and a second port (135) arranged to provide flow of liquid into and out of the chamber; and
a fluid source coupled to at least one of the first port and the second port, wherein said one of said first and second ports is located within said DUT chuck.

22. The system of claim 21, wherein the seal is mounted on the probe head assembly and is arranged to contact the DUT chuck when the DUT chuck is moved toward the probe head assembly.

23. The system of claim 21, wherein the seal is mounted on the DUT chuck and is arranged to contact the probe head assembly when the DUT chuck is moved toward the probe head assembly.

* * * * *